United States Patent
Bahl et al.

(10) Patent No.: US 10,354,742 B2
(45) Date of Patent: *Jul. 16, 2019

(54) SCAN COMPRESSION ARCHITECTURE FOR HIGHLY COMPRESSED DESIGNS AND ASSOCIATED METHODS

(71) Applicant: STMicroelectronics International N.V, Amsterdam (NL)

(72) Inventors: Swapnil Bahl, New Delhi (IN); Shray Khullar, New Delhi (IN)

(73) Assignee: STMicroelectronics International N.V., Amsterdam (NL)

( * ) Notice: Subject to any disclaimer, the term of this patent is extended or adjusted under 35 U.S.C. 154(b) by 15 days.

This patent is subject to a terminal disclaimer.

(21) Appl. No.: 15/420,720

(22) Filed: Jan. 31, 2017

(65) Prior Publication Data

US 2017/0140838 A1   May 18, 2017

Related U.S. Application Data

(63) Continuation of application No. 14/270,935, filed on May 6, 2014, now Pat. No. 9,606,180.

(51) Int. Cl.
| | |
|---|---|
| *G06F 11/25* | (2006.01) |
| *G11C 29/32* | (2006.01) |
| *G01R 31/3177* | (2006.01) |
| *G01R 31/3185* | (2006.01) |
| *G11C 29/34* | (2006.01) |

(52) U.S. Cl.
CPC .......... *G11C 29/32* (2013.01); *G01R 31/3177* (2013.01); *G01R 31/318541* (2013.01); *G01R 31/318547* (2013.01); *G06F 11/25* (2013.01); *G11C 29/34* (2013.01); *G11C 2029/3202* (2013.01)

(58) Field of Classification Search
CPC . G11C 29/32; G11C 29/34; G11C 2029/3202; G01R 31/3177; G01R 31/318541; G01R 31/318547; G06F 11/25

See application file for complete search history.

(56) References Cited

U.S. PATENT DOCUMENTS

| | | | |
|---|---|---|---|
| 2007/0283200 A1 | 12/2007 | Casarsa | |
| 2012/0182047 A1* | 7/2012 | Nomura | G01R 31/318575 326/54 |
| 2013/0055041 A1 | 2/2013 | Tekumalla | |
| 2014/0317463 A1* | 10/2014 | Chandra | G01R 31/318536 714/729 |

\* cited by examiner

*Primary Examiner* — April Y Blair
*Assistant Examiner* — Sazzad Hossain
(74) *Attorney, Agent, or Firm* — Slater Matsil, LLP

(57) ABSTRACT

An integrated circuit (IC) having a scan compression architecture includes decompression logic coupled between test access input and a block of IC elements (e.g. flip-flops) coupled together to define a plurality of scan paths. The block of IC elements includes an initial data selector at an initial position of each of the scan paths, and an additional data selector downstream within at least one of the scan paths and configured to reconfigure an order of the IC elements within the at least one scan path. Compression logic is coupled between the block of IC elements and a test access output.

20 Claims, 5 Drawing Sheets

SCAN COMPRESSION ARCHITECTURE FOR HIGHLY COMPRESSED DESIGNS AND ASSOCIATED METHODS

CROSS-REFERENCE TO RELATED APPLICATIONS

This is a continuation of U.S. patent application Ser. No. 14/270,935, filed May 6, 2014, entitled "Scan Compression Architecture for Highly Compressed Designs and Associated Methods," which application is hereby incorporated herein by reference.

FIELD OF THE INVENTION

The present invention relates to the field of integrated circuits, and, more particularly, to scan compression testing of integrated circuits and related methods.

BACKGROUND OF THE INVENTION

Automatic test pattern generation (ATPG) is used to identify test sequences which can be applied to circuits to determine whether they operate correctly. In ATPG, test patterns are generated and used to test semiconductor devices after manufacture. Test patterns may also be used to assist in the determination of the causes of defects.

Effective testing of integrated circuits (ICs) significantly enhances the ability of IC developers and manufacturers to provide reliable devices. Various techniques have been employed to test res during the manufacturing process. One such technique that is commonly known, and has been used within the industry for over twenty years is scan testing.

Scan testing provides an efficient approach to testing the structural integrity of devices, such as flip-flops, within a complex IC. Scan testing does not test integrated circuit-level functionality. Rather, test personnel use scan testing to confirm that individual flip-flops within an IC function properly. The number of flip-flops within an IC, which is often greater than a million, presents a challenge for testing. Scan testing addresses this challenge through the use of automated test units that provide test vectors to scan paths including thousands of flip-flops within ICs that have been designed to support scan testing.

Typically, complex ICs are designed and implemented as a series of interconnected functional blocks, each of which can be tested independently. Devices, such as flip-flops, within these functional blocks can be designed, such that they can be connected together in a scan path to support scan testing. Flip-flops and other elements within a scan path include, in addition to inputs and outputs used for normal operation, two inputs associated with the scan testing capability. These include a scan input (SI) and a scan enable (SE) input. Flip-flops within a scan path have their output connected to the SI input of a subsequent flip-flop. The first flip-flop within a scan path receives its input from an automated test unit through a test access port on the chip. The last flip-flop within a scan path provides its output to the automated test unit through a test access port. Many scan paths can exist within a single IC.

While scan testing provides significant benefits, challenges exist related to compression. A compression architecture generally includes a decompressor receiving test input bit streams from a set of pins to load the plurality of scan chains. The IC is tested with the scan chains and produces corresponding test output bit streams. A compressor receives the test output bit streams and compresses it in a scan output that is compared to a predicted pattern to determine whether an error occurred during testing.

The scan compression factor is increasing, e.g. 60-80× is becoming common. There is a demand to go beyond 100× and beyond. For most of the designs with high compression, the Quality of Results (QoR) is not as expected, e.g. coverage drop greater than 1% is common. And, real compression may be very low due to pattern inflation, e.g. about 3-5× with respect to internal scan mode. QoR may also be affected by the increase in dependency at the input side, and/or fault masking at the output side.

Referring to FIGS. 1A, 1B, 1C and 2, existing scan compression testing approaches will be discussed. FIGS. 1A, 1B and 1C schematically illustrate a portion of a scan compression architecture 10 including scan paths (e.g. columns 1-8) of flip-flops FF that are input (e.g. via inputs X and Y, and data selectors M) with values (i.e. 1s and 0s) according to selected test patterns and within modes (e.g. Modes 00, 01, 10 etc.). Such approaches include a horizontal dependency (e.g. within a row) on the values loaded into the scan paths (e.g. repeating 0 and 1 in the rows in Mode 00, or repeating 0, 0, 1, 1 in the rows of Mode 01 etc.). Two scan paths may be forced to have the same load value and possibly the same unload value, and due to the compression (e.g. using XOR gates), the resulting data does not indicate which scan path includes a faulty flip-flop. This defeats the goals of compression because the number of patterns may need to be increased to achieve the desired results.

FIG. 2 illustrates an example of an adaptive mode scan compression architecture 20 that includes the use of data selectors M (or MUXs) that are controlled to vary the mode of scan compression during the test (e.g. at each clock pulse) as the load values are shifted through the scan path of flip-flops FF. This may reduce some horizontal dependency but requires more complex control and interpretation of results.

These discussed problems are common in designs with high compression and negatively affect coverage and compression factor. Real compression is low compared to implemented compression. To compensate the loss of coverage, incremental patterns are generated in internal scan mode. Scan length is huge is internal scan mode and increases test time and test data volume heavily (i.e. overall compression goes further down).

SUMMARY OF THE INVENTION

An integrated circuit (IC) having a scan compression architecture includes decompression logic coupled between test access input and a block of IC elements (e.g. flip flops) coupled together to define a plurality of scan paths. The block of IC elements includes an initial data selector at an initial position of each scan path, and an additional data selector downstream within at least one scan path and configured to reconfigure an order of the IC elements within the at least one scan path. Compression logic is coupled between the block of IC elements and a test access output.

An additional data selector may be provided in subsequent scan paths of the plurality of scan paths except a first scan path. The additional data selector IS at a different position in each of the subsequent scan paths. Each of the plurality of scan paths may have the same length and the additional data selector may be at a sequentially different position in each of the subsequent scan paths.

A mode select input may be coupled to the initial data selector in each scan paths and coupled to the additional data selector in the at least one scan path. The mode select input is configured to control the initial data selector and the additional data selector to implement at least two different modes of scan compression having different load value and unload value dependencies within the block of IC elements.

Another aspect is directed to a scan compression architecture for an integrated circuit (IC) comprising a block of IC elements coupled together to define a plurality of scan paths each having a scan input and a scan output. An initial data selector is at an initial position of each scan path, and an additional data selector is downstream within at least one scan path and configured to reconfigure an order of the IC elements within the at least one scan path. A mode select input is configured to control the initial data selector and the additional data selector to implement at least two different modes of scan compression having different load value and unload value dependencies within the block of IC elements.

A method aspect is directed to making an integrated circuit (IC) having a scan compression architecture. The method includes coupling decompression logic between a test access input and a block of IC elements coupled together to define a plurality of scan paths, and providing an initial data selector at an initial position of each scan path. The method further includes providing an additional data selector downstream within at least one scan path and configured to reconfigure an order of the IC elements within the at least one scan path. Compression logic is coupled between the block of IC elements and a test access output.

Providing the additional data selector may include providing the additional data selector In subsequent scan paths of the plurality of scan paths except a first scan path, and providing the additional data selector at a different position in each of the subsequent scan paths. Each of the plurality of scan paths may have a same length, and the additional data selector is provided at a sequentially different position in each of the subsequent scan paths.

The method may further include coupling a mode select input to the initial data selector in each scan path, and to the additional data selector in the at least one scan path. The mode select input is configured to control the initial data selector and the additional data selector to implement at least two different modes of scan compression having different load value and unload value dependencies within the block of IC elements.

Another method aspect is directed to scan compression testing for an integrated circuit (IC) including a block of IC elements coupled together to define a plurality of scan paths. The method includes inputting scan compression load values to the plurality of scan paths, and selectively implementing at least first and second modes of scan compression each having different load value and unload value dependencies within the block of IC elements by reconfiguring an order of the IC elements within at least one scan path of the plurality of scan paths. Scan compression unload values are outputted from the plurality of scan paths.

Reconfiguring may include reconfiguring the order of the IC elements in each subsequent scan path of the plurality of scan paths except a first scan path. Also, each of the plurality of scan paths may have the same length, and reconfiguring comprises controlling a data selector at a sequentially different position in each of the subsequent scan paths.

The embodiments of the present invention may provide gains in test coverage loss and pattern inflation in scan compressed designs with respect to an internal scan mode, and reduce the need for generating internal scan patterns.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 1A:
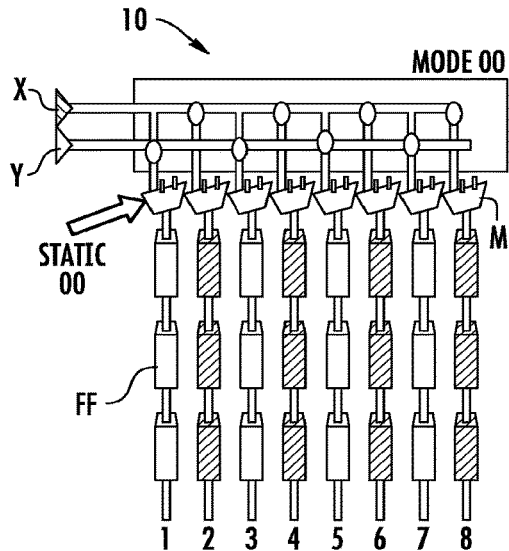
FIGS. 1A, 1B and 1C are schematic diagrams illustrating a known scan compression architecture having various modes and horizontal dependencies according to the prior art.
Figure 1B:
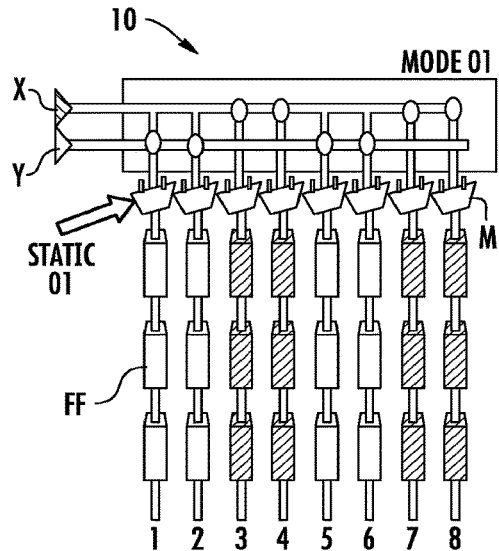
Figure 1C:
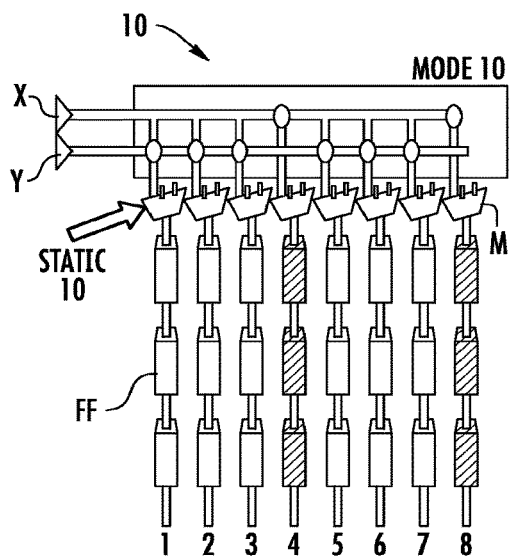
Figure 2:
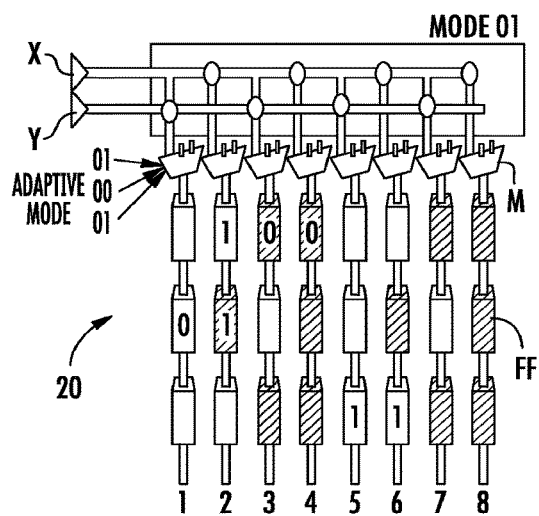
FIG. 2 is a schematic diagram illustrating a scan compression architecture having an adaptive mode according to the prior art.
Figure 3:
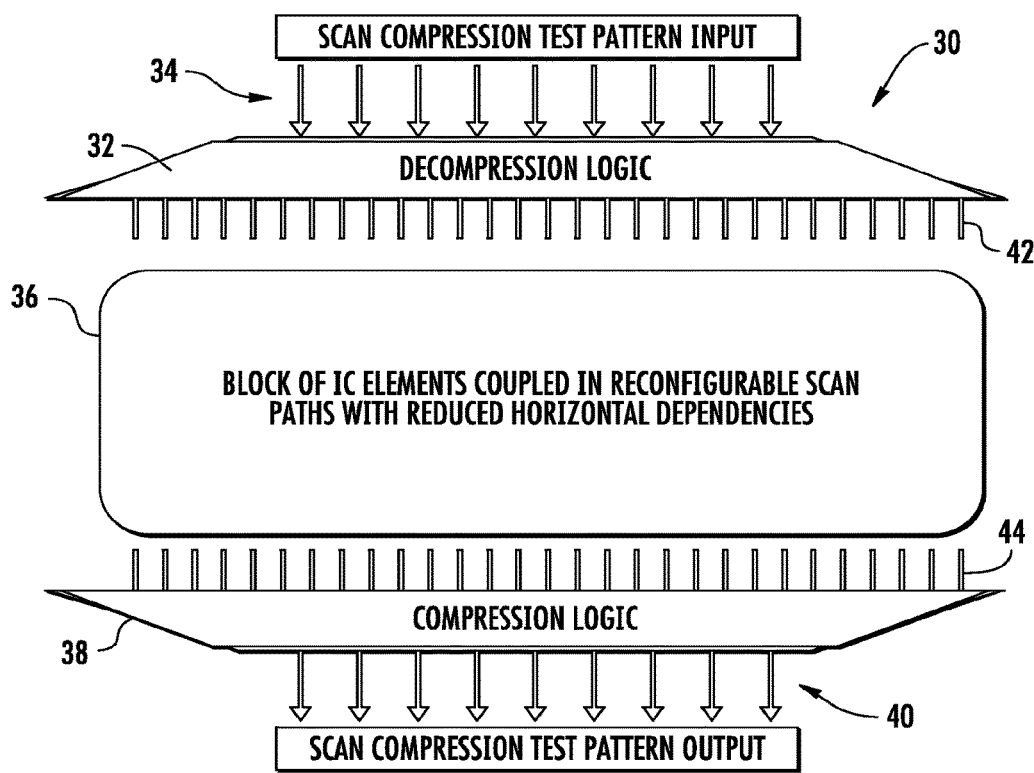
FIG. 3 is schematic diagram illustrating an integrated circuit including a scan compression architecture according to features of the present invention.
Figure 4:
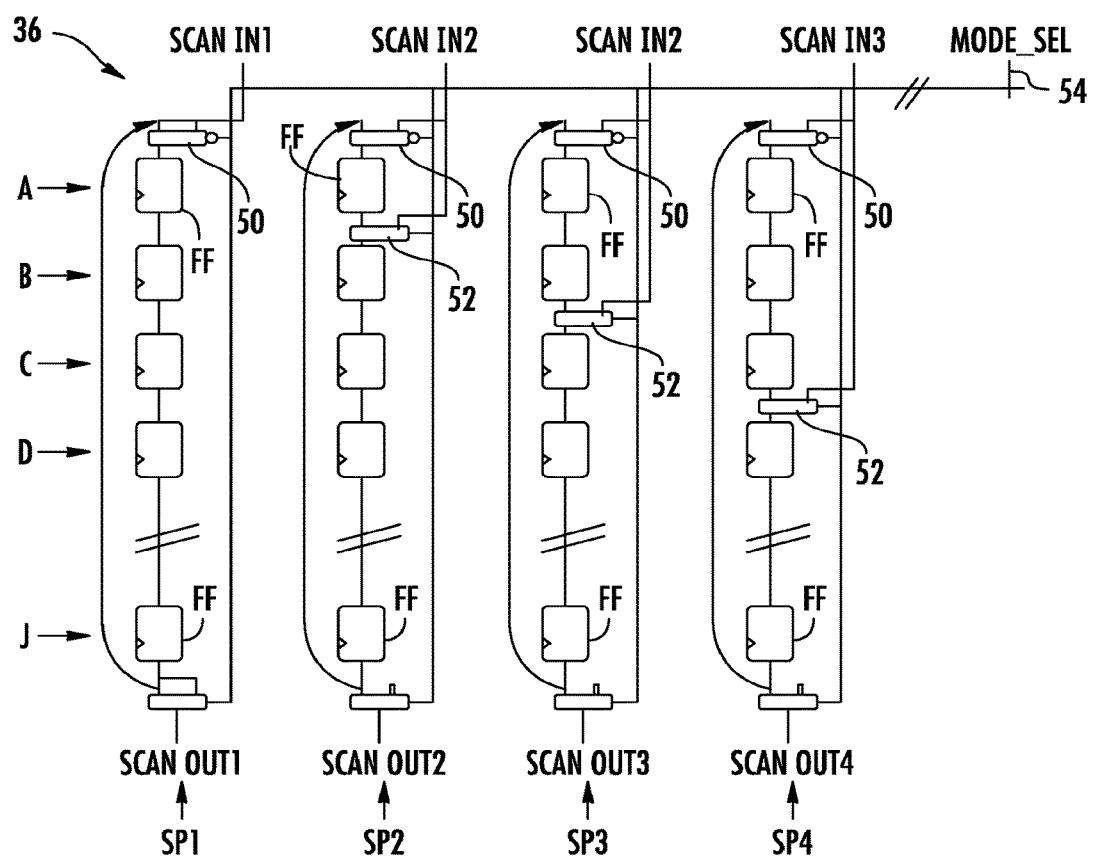
FIG. 4 is schematic diagram illustrating details of the scan compression architecture including reconfigurable scan paths according to features of the present invention.

Referring initially to FIGS. 3 and 4, an integrated circuit (IC) 30 having a scan compression architecture with reconfigurable scan paths will be described. The integrated circuit 30 includes decompression logic 32 coupled between test access input 34 and a block 36 of IC elements FF (e.g. flip flops) coupled together to define a plurality of scan paths SP1-SPN. Compression logic 38 is coupled between the block 36 of IC elements FF and a test access output 40. The decompression logic expands the test patterns on the test access inputs 34 to the scan path load values 42. The compression logic reduces the scan path unload values 44 to the test pattern outputs on the test access output 40. The connections between the decompression logic 32, the block 36 and the compression logic 38 will be readily understood by those skilled in the aft.

The block 36 of IC elements FF includes an initial data selector 50 at an initial position of each of the scan paths SP1-SPN, and an additional data selector 52 downstream within at least one of the scan paths SP2-SPN and configured to reconfigure an order of the IC elements FF within a respective scan path. As illustrated, an additional data selector 52 is provided in subsequent scan paths SP2-SPN of the plurality of scan paths except a first scan path SP1. The additional data selector 52 is at a different position in each of the subsequent scan paths SP2-SPN. Indeed, each of the plurality of scan paths SP1-SPN may preferably have the same length and the additional data selector 52 is at a sequentially different position in each of the subsequent scan paths SP2-SPN.

A mode select input 54 is coupled to the initial data selector 50 in each of the scan paths SP1-SPN, and also coupled to the additional data selector 52 in the subsequent scan paths SP2-SPN. The mode select input is configured to control the initial data selectors 50 and the additional data selectors 52 to implement at least two different modes of scan compression having different load value and unload value dependencies within the block 36 of IC elements FF.

Indeed, the additional data selector 52 operates as an order selection MUX that stitches or reconfigures the order of the IC elements FF within the scan paths SP2-SPN. For example, in a selected mode, within scan path SP2, the additional data selector 52 is controlled to change the order of IC elements FF so that the IC element FF in row B becomes the first element in the scan path SP2 while the element in row A becomes the last element in the scan path. Thus, the scan compression architecture of the present approach can be operated to implement at least two different modes of scan compression, for example, the standard mode and the order-reconfiguration mode.

Figures 6A, 6B:
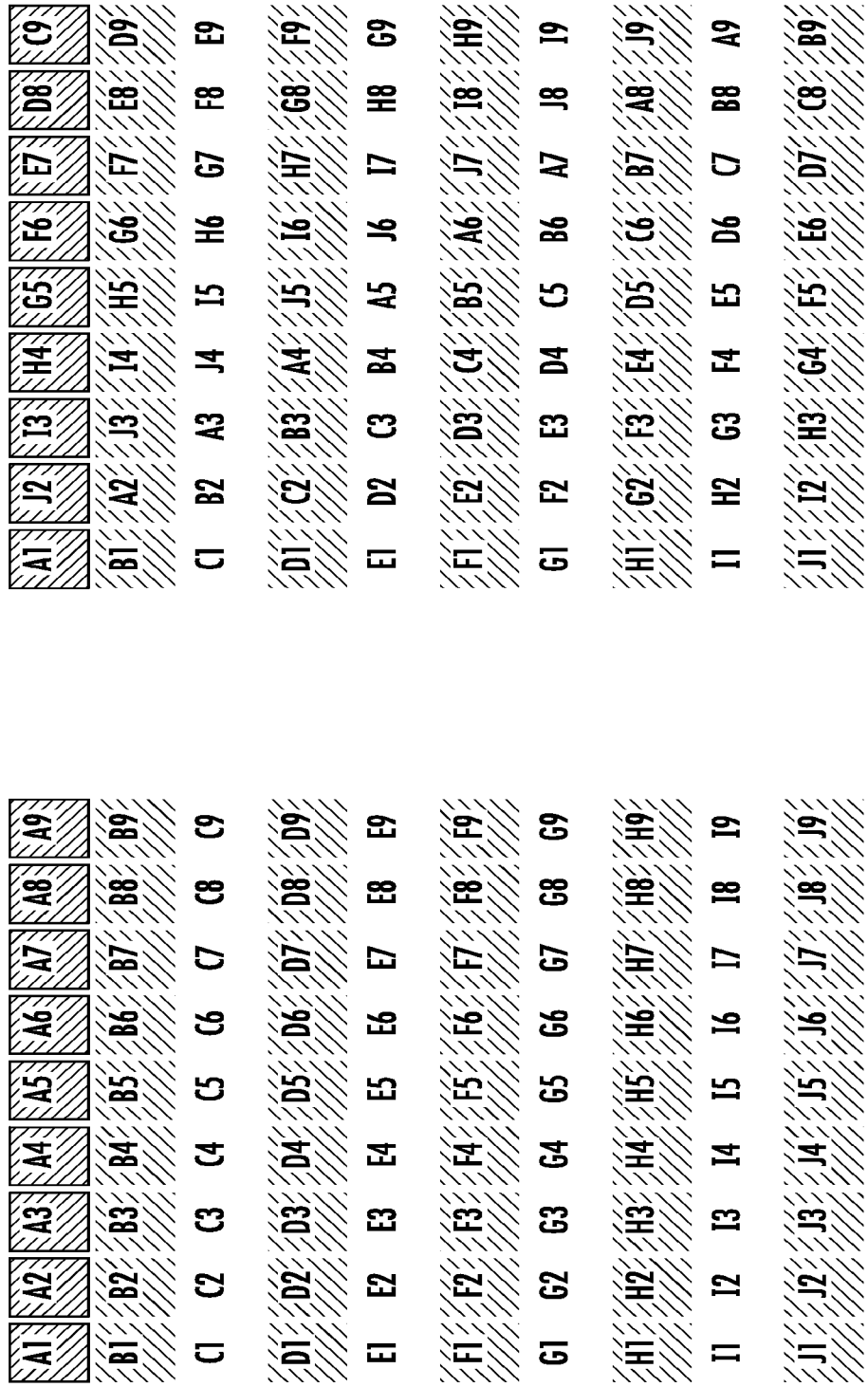
FIGS. 6A and 6B are tables illustrating the order of IC elements within the reconfigurable scan paths in different modes of the scan compression test of FIG. 5.

Thus, two modes of scan compression can be implemented with different distributions for load and unload dependency, as illustrated in the tables of FIGS. 6A and 68. As can be seen, the horizontal dependencies of the values in the standard mode (FIG. 6A) have become diagonal dependencies in the order-reconfiguration mode (FIG. 6B). The approach may minimize coverage drop and achieve high pattern compression while decreasing the test cost as compared to internal scan mode. There is potentially no need for an incremental internal scan mode, and there may be no significant increase in congestion.

One method aspect is directed to making an integrated circuit (IC) 30 having a scan compression architecture. The method includes coupling decompression logic 32 between a test access input 34 and a block 36 of IC elements FF coupled together to define a plurality of scan paths SP1-SPN, and providing an initial data selector 50 at an initial position of each of the scan paths. The method further includes providing an additional data selector 52 downstream within at least one of the scan paths SP2-SPN and configured to reconfigure an order of the IC elements FF within the scan path. Compression logic 38 is coupled between the block 36 of IC elements FF and a test access output 40.

Providing the additional data selector 52 may include providing an additional data selector 52 in subsequent scan paths SP2-SPN of the plurality of scan paths except a first scan path SP1, and providing the additional data selector at a different position in each of the subsequent scan paths. Each of the plurality of scan paths SP1-SPN may have a same length, and the additional data selector 52 may be provided at a sequentially different position in each of the subsequent scan paths SP2-SPN.

The method may further include coupling a mode select input 54 to the initial data selector 50 in each of the scan paths SP1-SPN, and to the additional data selector 52 in the subsequent scan paths SP2-SPN. The mode select input 54 is configured to control the initial data selectors 50 and the additional data selectors 52 to implement at least two different modes of scan compression having different load value and unload value dependencies within the block 36 of IC elements FF, as discussed above.

Figure 5:
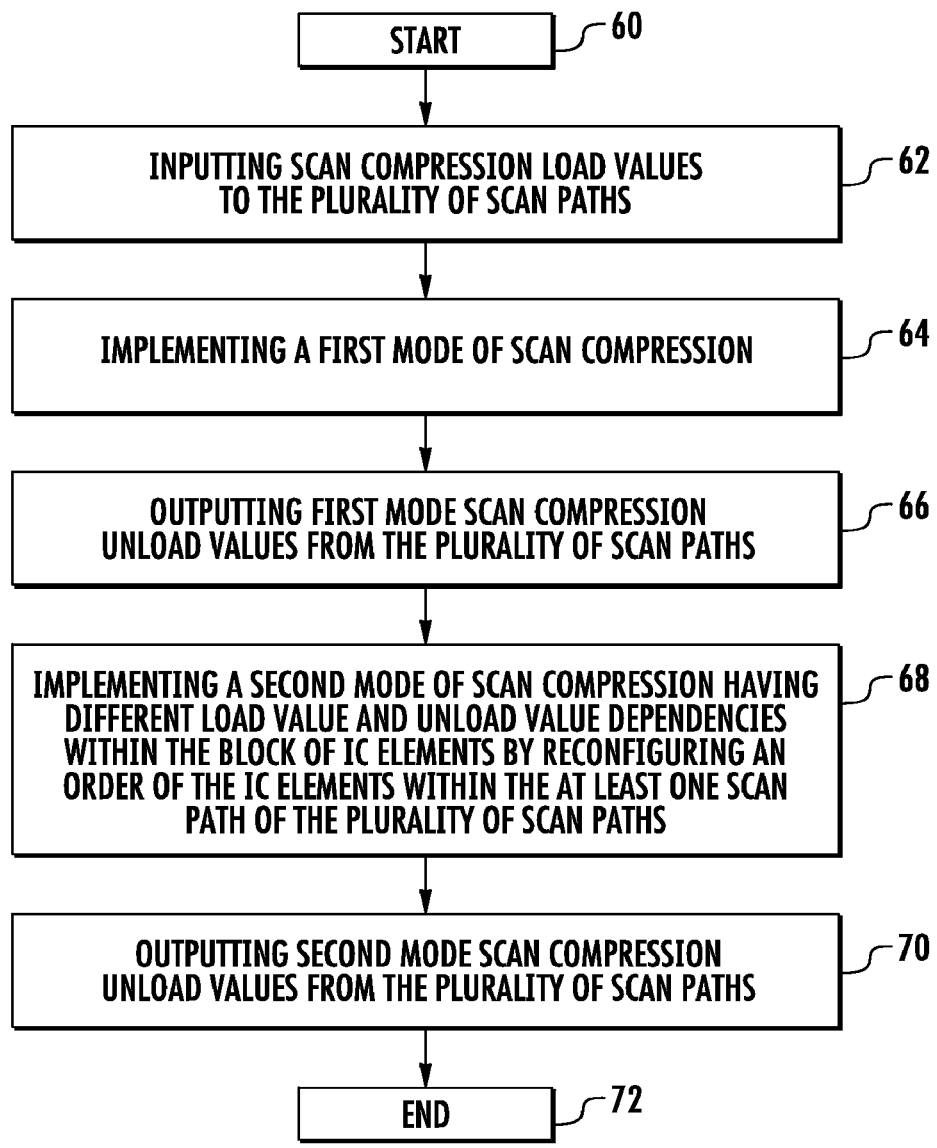
FIG. 5 is a flowchart illustrating method steps of a scan compression test of the integrated circuit of FIGS. 3 and 4.

Referring now additionally to the flowchart of FIG. 5, another method aspect of the present approach is described. The method begins (block 60) and is directed to scan compression testing for an integrated circuit (IC) 30 including a block 36 of IC elements FF coupled together to define a plurality of scan paths SP1-SPN. The method includes inputting scan compression load values to the plurality of scan paths (block 62), and selectively implementing at least first mode (block 64) and a second mode (block 68) of scan compression each having different load value and unload value dependencies within the block 36 of IC elements FF by reconfiguring an order of the IC elements FF within at least one scan path SP2-SPN of the plurality of scan paths SP1-SPN. Scan compression unload values are outputted from the plurality of scan paths (blocks 66 and 70) before ending the method at block 72.

Reconfiguring may include reconfiguring the order of the IC elements FF in each subsequent scan path SP2-SPN of the plurality of scan paths except a first scan path SP1. Also, each of the plurality of scan paths SP1-SPN may have the same length, and reconfiguring comprises controlling an additional data selector 52 at a sequentially different position in each of the subsequent scan paths SP2-SPN.

The embodiments of the present invention may provide gains in test coverage loss and pattern inflation in scan compressed designs with respect to an internal scan mode, and reduce the need for generating internal scan patterns.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

What is claimed is:

1. A circuit, comprising:
    a first plurality of integrated circuit (IC) elements coupled in a first sequential arrangement to define a first scan path;
    a first initial data selector coupled to an input of an initial IC element of the first scan path; and
    a second plurality of IC elements coupled in a plurality of sequential arrangements to define a plurality of downstream scan paths, the plurality of downstream scan paths being parallel to each other, a respective downstream scan path comprising:
        a second initial data selector coupled to an input of an initial IC element of the respective downstream scan path; and
        an intermediate data selector located at a given position along the respective downstream scan path and sequentially moved down one additional IC element with respect to an intermediate data selector of a preceding downstream scan path, wherein the given position along the respective downstream scan path has a corresponding position along the preceding downstream scan path, and wherein the corresponding position along the preceding downstream scan path is devoid of a data selector.

2. The circuit of claim 1, wherein the intermediate data selector is configured to reconfigure an order of the second plurality of IC elements in the respective downstream scan path during a testing of the circuit.

3. The circuit of claim 1, wherein the plurality of downstream scan paths is parallel to the first scan path.

4. The circuit of claim 1, wherein the intermediate data selector is configured to reconfigure an order of the second plurality of IC elements in the respective downstream scan path in response to a control signal received by the intermediate data selector.

5. The circuit of claim 4, wherein the first initial data selector and the second initial data selector are configured to receive the control signal.

6. The circuit of claim 1, wherein the first plurality of IC elements and the second plurality of IC elements comprise a flip-flop.

7. The circuit of claim 1, wherein a number of IC elements in the first scan path is equal to a number of IC elements in at least one of the plurality of downstream scan paths.

8. A circuit, comprising:
a first sequential arrangement of integrated circuit (IC) elements;
a second sequential arrangement of IC elements;
a first data selector and a second data selector coupled to an initial input of the first sequential arrangement and an initial input of the second sequential arrangement, respectively; and
a third data selector coupled between successive IC elements of the second sequential arrangement, the third data selector being sequentially moved down at least one additional IC element with respect to the first data selector, wherein the third data selector is located at a given position along the second sequential arrangement, and wherein the given position along the second sequential arrangement has a corresponding position along the first sequential arrangement, and wherein no data selector is positioned at the corresponding position along the first sequential arrangement.

9. The circuit of claim 8, wherein the first sequential arrangement comprises a first IC test path and the second sequential arrangement comprises a second IC test path in parallel to the first IC test path.

10. The circuit of claim 8, wherein the first sequential arrangement is configured to receive a first input bit stream and the second sequential arrangement is configured to receive a second input bit stream.

11. The circuit of claim 10, wherein the first data selector is configured to control a gating of the first input bit stream to the first sequential arrangement, and wherein the second data selector and the third data selector are configured to control a gating of the second input bit stream to the second sequential arrangement.

12. The circuit of claim 10, wherein the third data selector is configured to reconfigure an order in which the IC elements of the second sequential arrangement receive the second input bit stream, the order being based on a mode select signal received by the third data selector.

13. The circuit of claim 8, further comprising a decompression logic configured to receive a test pattern input and generate a first input bit stream and a second input bit stream from the test pattern input, the first input bit stream and the second input bit stream being inputs for the first sequential arrangement and the second sequential arrangement, respectively.

14. The circuit of claim 8, further comprising a compression logic coupled to an output of the first sequential arrangement and an output of the second sequential arrangement, the compression logic being configured to generate a compressed test pattern output from the outputs of the first sequential arrangement and the second sequential arrangement.

15. A method, comprising:
providing a first test bit stream and a plurality of downstream test bit streams to a first sequential arrangement of integrated circuit (IC) elements and a plurality of downstream arrangements of IC elements, respectively; and
reconfiguring an order of the IC elements within the plurality of downstream arrangements using a control signal provided to an initial data selector coupled to an input of a respective downstream arrangement and to an intermediate data selector coupled between consecutive IC elements of the respective downstream arrangement, the intermediate data selector being located at a given position along the respective downstream arrangement and sequentially moved down one additional IC element with respect to an intermediate data selector of a preceding downstream arrangement, wherein the given position along the respective downstream arrangement has a corresponding position along the preceding downstream arrangement, and wherein the corresponding position along the preceding downstream arrangement is devoid of a data selector.

16. The method of claim 15, wherein providing the first test bit stream and the plurality of downstream test bit streams comprises:
generating, using decompression logic, the first test bit stream and the plurality of downstream test bit streams from a test pattern input received at the decompression logic.

17. The method of claim 15, further comprising:
generating, using compression logic, a test output from an output of each of the first sequential arrangement and the plurality of downstream arrangements.

18. The method of claim 17, further comprising:
comparing the test output to a predicted pattern of bits; and
determining, based on the comparing, whether an error occurred during a testing of the first sequential arrangement and the plurality of downstream arrangements.

19. The method of claim 15, wherein the IC elements of each of the plurality of downstream arrangements is arranged in parallel to the IC elements of the first sequential arrangement.

20. The method of claim 15, wherein the plurality of downstream arrangements and the first sequential arrangement comprises a flip-flop.

* * * * *